(12) United States Patent
Sanchez et al.

(10) Patent No.: US 9,512,520 B2
(45) Date of Patent: Dec. 6, 2016

(54) SEMICONDUCTOR SUBSTRATE PROCESSING SYSTEM

(75) Inventors: Errol Antonio C. Sanchez, Tracy, CA (US); David K. Carlson, San Jose, CA (US); Satheesh Kuppurao, San Jose, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 1127 days.

(21) Appl. No.: 13/441,382

(22) Filed: Apr. 6, 2012

(65) Prior Publication Data

US 2012/0266819 A1 Oct. 25, 2012

Related U.S. Application Data

(60) Provisional application No. 61/478,776, filed on Apr. 25, 2011.

(51) Int. Cl.
C23C 16/54 (2006.01)
C23C 16/06 (2006.01)
(Continued)

(52) U.S. Cl.
CPC ............... *C23C 16/54* (2013.01); *C23C 16/06* (2013.01); *C23C 16/4412* (2013.01); *C23C 16/45565* (2013.01); *C23C 16/45574* (2013.01); *H01L 21/67115* (2013.01); *H01L 21/67184* (2013.01); *H01L 21/67201* (2013.01); *H01L 21/67207* (2013.01)

(58) Field of Classification Search
CPC ............... C23C 16/54; C23C 16/4412; C23C 16/45565; C23C 16/45574; C23C 16/06; H01L 21/67207; H01L 21/67201; H01L 21/67115; H01L 21/67184

USPC .......................... 118/719; 156/345.31–345.34
See application file for complete search history.

(56) References Cited

U.S. PATENT DOCUMENTS

| 4,405,435 A | * | 9/1983 | Tateishi | B01J 3/006 |
| | | | | 118/719 |
| 4,800,105 A | * | 1/1989 | Nakayama | C23C 16/455 |
| | | | | 427/253 |

(Continued)

OTHER PUBLICATIONS

International Search Report and Written Opinion mailed Nov. 23, 2012 for PCT Application No. PCT/US2012/034374.

*Primary Examiner* — Rudy Zervigon
(74) *Attorney, Agent, or Firm* — Moser Taboada; Alan Taboada (57) ABSTRACT

Apparatus for processing substrates are provided. In some embodiments, a processing system may include a first transfer chamber and a first process chamber coupled to the transfer chamber, the process chamber further comprising a substrate support to support a processing surface of a substrate within the process chamber, an injector disposed to a first side of the substrate support and having a first flow path to provide a first process gas and a second flow path to provide a second process gas independent of the first process gas, wherein the injector provides the first and second process gases across the processing surface of the substrate, a showerhead disposed above the substrate support to provide the first process gas to the processing surface, and an exhaust port disposed to a second side of the substrate support, opposite the injector, to exhaust the first and second process gases from the process chamber.

17 Claims, 5 Drawing Sheets

(51) Int. Cl.
  *C23C 16/44* (2006.01)
  *C23C 16/455* (2006.01)
  *H01L 21/67* (2006.01)

(56) References Cited

U.S. PATENT DOCUMENTS

| | | | | |
|---|---|---|---|---|
| 4,849,260 | A * | 7/1989 | Kusumoto | C23C 16/14 257/E21.171 |
| 4,991,540 | A * | 2/1991 | Jurgensen | C23C 16/4583 118/715 |
| 4,993,360 | A * | 2/1991 | Nakamura | C23C 16/45582 118/715 |
| 4,994,301 | A * | 2/1991 | Kusumoto | C23C 16/045 427/124 |
| 5,024,182 | A * | 6/1991 | Kobayashi | C23C 16/452 118/715 |
| 5,077,875 | A * | 1/1992 | Hoke | C30B 25/02 118/715 |
| 5,096,534 | A * | 3/1992 | Ozias | C30B 29/06 117/101 |
| 5,105,761 | A * | 4/1992 | Charlet | H01J 37/3244 118/719 |
| 5,186,718 | A | 2/1993 | Tepman et al. | |
| 5,370,738 | A * | 12/1994 | Watanabe | C30B 25/14 118/715 |
| 5,534,069 | A * | 7/1996 | Kuwabara | B01D 53/72 118/715 |
| 5,551,982 | A * | 9/1996 | Anderson | C23C 16/455 118/715 |
| 5,772,771 | A * | 6/1998 | Li | C23C 16/4405 118/715 |
| 5,851,589 | A * | 12/1998 | Nakayama | C23C 16/08 427/248.1 |
| 5,879,574 | A * | 3/1999 | Sivaramakrishnan | C23C 16/4405 134/1.1 |
| 5,914,050 | A * | 6/1999 | Comita | C23C 16/4405 118/715 |
| 5,916,369 | A * | 6/1999 | Anderson | C23C 16/455 118/715 |
| 5,939,831 | A * | 8/1999 | Fong | C23C 16/4405 134/1.1 |
| 5,968,587 | A * | 10/1999 | Frankel | C23C 16/4404 219/390 |
| 5,994,209 | A * | 11/1999 | Yieh | C23C 16/401 257/E21.149 |
| 6,070,551 | A * | 6/2000 | Li | C23C 16/401 118/715 |
| 6,090,211 | A * | 7/2000 | Kamei | C23C 16/45574 118/715 |
| 6,093,252 | A * | 7/2000 | Wengert | B01J 3/006 118/715 |
| 6,153,260 | A * | 11/2000 | Comita | C23C 16/4408 118/719 |
| 6,281,141 | B1 * | 8/2001 | Das | H01L 21/0214 257/E21.268 |
| 6,306,216 | B1 * | 10/2001 | Kim | C23C 16/4412 118/715 |
| 6,321,680 | B2 * | 11/2001 | Cook | 118/625 |
| 6,347,636 | B1 * | 2/2002 | Xia | B08B 7/0035 134/1.1 |
| 6,500,734 | B2 * | 12/2002 | Anderson | C23C 16/45504 438/478 |
| 6,592,674 | B2 * | 7/2003 | Sakai | C23C 16/455 118/715 |
| 6,806,211 | B2 * | 10/2004 | Shinriki | C23C 16/40 118/715 |
| 6,820,570 | B2 * | 11/2004 | Kilpela | C23C 16/4412 118/723 E |
| 6,899,764 | B2 * | 5/2005 | Frijlink | C23C 16/4412 118/715 |
| 6,927,140 | B2 * | 8/2005 | Soman | H01L 21/02381 257/E21.106 |
| 7,153,542 | B2 * | 12/2006 | Nguyen | H01L 21/67173 118/719 |
| 7,229,666 | B2 * | 6/2007 | Mardian | C23C 16/4401 117/84 |
| 7,368,368 | B2 | 5/2008 | Emerson | |
| 7,387,686 | B2 * | 6/2008 | Iwamoto | C23C 16/45527 118/715 |
| 7,422,636 | B2 * | 9/2008 | Ishizaka | C23C 16/4401 118/663 |
| 7,534,730 | B2 * | 5/2009 | Ozaki | H01L 21/0223 118/719 |
| 7,608,549 | B2 * | 10/2009 | Van Nooten | C23C 16/045 257/E21.019 |
| 7,815,739 | B2 * | 10/2010 | Matsuura | H01L 21/31116 118/719 |
| 8,088,223 | B2 * | 1/2012 | Todd | C23C 16/45523 118/695 |
| 8,147,137 | B2 * | 4/2012 | Patalay | H01L 21/67248 118/725 |
| 8,148,271 | B2 * | 4/2012 | Ueno | C23C 16/463 118/696 |
| 8,282,735 | B2 * | 10/2012 | Choi | H01L 21/68792 118/715 |
| 8,486,191 | B2 * | 7/2013 | Aggarwal | C23C 16/04 118/715 |
| 8,512,472 | B2 * | 8/2013 | Vatus | C23C 16/45504 118/715 |
| 8,623,765 | B2 * | 1/2014 | Ozawa | C23C 16/54 118/715 |
| 8,960,235 | B2 * | 2/2015 | Carlson | C23C 16/45565 118/715 |
| 8,980,005 | B2 * | 3/2015 | Carlson | C23C 16/4404 118/715 |
| 8,992,685 | B2 * | 3/2015 | Kato | H01L 21/67109 118/719 |
| 9,011,634 | B2 * | 4/2015 | Matsuda | H01J 37/32743 118/719 |
| 9,023,429 | B2 * | 5/2015 | Takeshima | H01L 21/67109 118/719 |
| 9,028,614 | B2 * | 5/2015 | Hara | C30B 25/08 118/724 |
| 9,157,152 | B2 * | 10/2015 | Faguet | C23C 16/452 |
| 2001/0020516 | A1 * | 9/2001 | Khan | H01L 21/3065 156/345.24 |
| 2002/0170671 | A1 | 11/2002 | Matsushita et al. | |
| 2003/0015137 | A1 * | 1/2003 | Sakai | C23C 16/45565 118/715 |
| 2003/0045131 | A1 * | 3/2003 | Verbeke | H01L 21/67069 438/795 |
| 2003/0049372 | A1 * | 3/2003 | Cook | C23C 16/24 427/248.1 |
| 2003/0053893 | A1 * | 3/2003 | Matsunaga | C23C 16/54 414/217 |
| 2003/0230385 | A1 * | 12/2003 | Bach | H01J 37/32009 156/345.49 |
| 2004/0050326 | A1 * | 3/2004 | Thilderkvist | C23C 16/45561 118/715 |
| 2004/0069225 | A1 * | 4/2004 | Fairbairn | H01L 21/67201 118/715 |
| 2004/0139914 | A1 * | 7/2004 | Yamazaki | C23C 14/12 118/719 |
| 2005/0000440 | A1 * | 1/2005 | Nakano et al. | 118/723 E |
| 2005/0005851 | A1 * | 1/2005 | Keshner | C23C 16/4412 118/723 E |
| 2006/0096540 | A1 * | 5/2006 | Choi | C23C 16/45574 118/724 |
| 2006/0130761 | A1 * | 6/2006 | Sakai | C23C 16/45523 118/719 |
| 2006/0156979 | A1 * | 7/2006 | Thakur | C23C 16/45546 118/715 |
| 2006/0180082 | A1 * | 8/2006 | Iwamoto | C23C 16/45527 118/724 |
| 2006/0223286 | A1 * | 10/2006 | Chin | C23C 16/45525 438/478 |
| 2007/0017445 | A1 * | 1/2007 | Takehara | C23C 14/568 118/719 |

(56) References Cited

U.S. PATENT DOCUMENTS

| | | | |
|---|---|---|---|
| 2007/0020903 A1* | 1/2007 | Takehara | C23C 14/568 438/592 |
| 2007/0080141 A1* | 4/2007 | White | H01J 37/321 216/68 |
| 2007/0101939 A1* | 5/2007 | Sumakeris | C23C 16/4401 118/724 |
| 2007/0181057 A1 | 8/2007 | Lam et al. | |
| 2007/0184210 A1* | 8/2007 | Hwang | C23C 16/45504 427/569 |
| 2007/0196011 A1* | 8/2007 | Cox | G01N 21/33 382/145 |
| 2008/0220150 A1* | 9/2008 | Merry | C23C 16/45591 427/8 |
| 2009/0029528 A1* | 1/2009 | Sanchez | C30B 25/08 438/476 |
| 2009/0095420 A1* | 4/2009 | Sawayama | C23C 16/24 156/345.1 |
| 2009/0126631 A1* | 5/2009 | Liu | C23C 16/4412 118/719 |
| 2009/0126632 A1* | 5/2009 | Harroun | C23C 16/45565 118/723 E |
| 2010/0075488 A1* | 3/2010 | Collins | C23C 16/45551 438/507 |
| 2010/0186669 A1* | 7/2010 | Shin | C23C 16/45546 118/719 |
| 2010/0272892 A1* | 10/2010 | Kobayashi | C23C 16/45574 427/255.5 |
| 2010/0275848 A1* | 11/2010 | Fukuda | C23C 16/325 118/728 |
| 2011/0039418 A1* | 2/2011 | Kabe | C23C 16/0272 438/762 |
| 2011/0175140 A1* | 7/2011 | Taylor | H01J 37/321 257/190 |
| 2012/0201959 A1* | 8/2012 | Choi | C23C 16/02 427/255.394 |
| 2012/0240853 A1* | 9/2012 | Carlson | C23C 16/4404 118/715 |
| 2012/0258259 A1* | 10/2012 | Bansal | C23C 16/0272 427/558 |
| 2012/0266819 A1* | 10/2012 | Sanchez | C23C 16/4412 118/719 |
| 2012/0270384 A1* | 10/2012 | Sanchez | C23C 16/0236 438/503 |
| 2013/0109159 A1* | 5/2013 | Carlson | C23C 16/45565 438/503 |
| 2014/0116336 A1* | 5/2014 | Brillhart | B05B 1/005 118/715 |
| 2014/0137801 A1* | 5/2014 | Lau | C30B 25/14 118/728 |
| 2014/0224174 A1* | 8/2014 | Abedijaberi | C23C 16/45563 118/715 |
| 2014/0261185 A1* | 9/2014 | Aboagye | C23C 16/4411 118/728 |
| 2014/0322897 A1* | 10/2014 | Samir | H01L 21/67017 438/478 |
| 2014/0326185 A1* | 11/2014 | Lau | C23C 16/45563 118/728 |
| 2015/0176123 A1* | 6/2015 | Carlson | C23C 16/4404 118/715 |

* cited by examiner

FIG. 6

SEMICONDUCTOR SUBSTRATE PROCESSING SYSTEM

CROSS-REFERENCE TO RELATED APPLICATIONS

This application claims benefit of U.S. provisional patent application Ser. No. 61/478,776, filed Apr. 25, 2011, which is herein incorporated by reference.

FIELD

Embodiments of the present invention generally relate to a substrate processing systems.

BACKGROUND

As the critical dimensions of complementary metal oxide semiconductor (CMOS) devices continue to shrink, novel materials need to be incorporated into CMOS architecture, for example, to improve energy efficiency and/or speed. One such group of materials is III-V materials, which may be utilized, for example, in the channel of a transistor device. Unfortunately, current processing apparatus and methods fail to yield III-V films having suitable material quality, such as low defect density, composition control, high purity, morphology, in-wafer uniformity, and run to run reproducibility. Further, current processing apparatus for III-V materials are not integrated, for example in a cluster tool, with other CMOS device processing apparatus, for example such as process chambers to facilitate pre-clean, annealing, and/or deposition of high-k dielectric materials, due to compatibility issues. For example, such compatibility issues may be small substrate sizes, poor III-V film purity or quality, and/or poor chamber serviceability.

Accordingly, the inventors have provided improved methods and apparatus for the deposition of materials on a substrate, such as for example, III-V materials.

SUMMARY

Apparatus for processing substrates are provided herein. In some embodiments, the inventive apparatus may advantageously be used for the processing substrates using III-V materials. In some embodiments, a processing system may include a first transfer chamber capable of transferring a substrate to or receiving a substrate from one or more process chambers coupled to the first transfer chamber and a first process chamber to deposit one or more III-V materials coupled to the transfer chamber, the process chamber further comprising a substrate support disposed therein to support a processing surface of a substrate at a desired position within the process chamber, an injector disposed to a first side of the substrate support and having a first flow path to provide a first process gas and a second flow path to provide a second process gas independent of the first process gas, wherein the injector is positioned to provide the first and second process gases across the processing surface of the substrate, a showerhead disposed above the substrate support to provide the first process gas to the processing surface of the substrate, and an exhaust port disposed to a second side of the substrate support, opposite the injector, to exhaust the first and second process gases from the process chamber.

In some embodiments, a processing system may include a first transfer chamber capable of transferring a substrate to or receiving a substrate from one or more process chambers coupled to the transfer chamber, and a first process chamber to deposit one or more III-V materials coupled to the transfer chamber, the process chamber further comprising a substrate support disposed therein to support a processing surface of a substrate at a desired position within the process chamber, an injector disposed to a first side of the substrate support and having a first flow path to provide a first process gas and a second flow path to provide a second process gas independent of the first process gas, wherein the injector is positioned to provide the first and second process gases across the processing surface of the substrate, a first gas source coupled to the injector to provide the first process gas, wherein the first process gas comprises a Group III element, a second gas source coupled to the injector to provide the second process gas, wherein the second process gas comprises a Group V element, and an exhaust port disposed to a second side of the substrate support, opposite the injector, to exhaust the first and second process gases from the process chamber.

In some embodiments, a processing system for depositing III-V materials may include a first transfer chamber having a first robot configured to transfer substrates between process chambers coupled to the first transfer chamber, a second transfer chamber having a second robot configured to transfer substrates between process chambers coupled to the second transfer chamber, one or more intermediate loadlocks disposed between and coupling the first transfer chamber to the second transfer chamber such that chamber parameters within the first and second transfer chambers are independently controlled, a first process chamber to deposit III-V materials coupled to the first transfer chamber, one or more of a second or third process chamber coupled to the second transfer chamber respectively configured to plasma clean a substrate or deposit a high-k dielectric on a substrate, one or more of a fourth or fifth process chamber coupled to the first transfer chamber respectively configured to anneal a substrate or deposit III-V materials; and one or more second loadlock chambers coupled to the second transfer chamber and configured to facilitate substrate entry into or egress from the cluster tool.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods and apparatus for deposition of materials on a substrate are provided herein. In some embodiments, the inventive methods and apparatus may advantageously be used for the deposition of III-V materials on a substrate. The inventive methods and apparatus advantageously provide for the deposition of III-V films suitable for complementary metal oxide semiconductor (CMOS) applications. In some embodiments, the inventive apparatus may advantageously provide for incorporation of III-V materials, such as gallium arsenide (GaAs), indium gallium arsenide (InGaAs), indium aluminum arsenide (InAlAs), indium phosphide (InP), and the like, into mainstream silicon-based CMOS device manufacturing.

Figure 1:
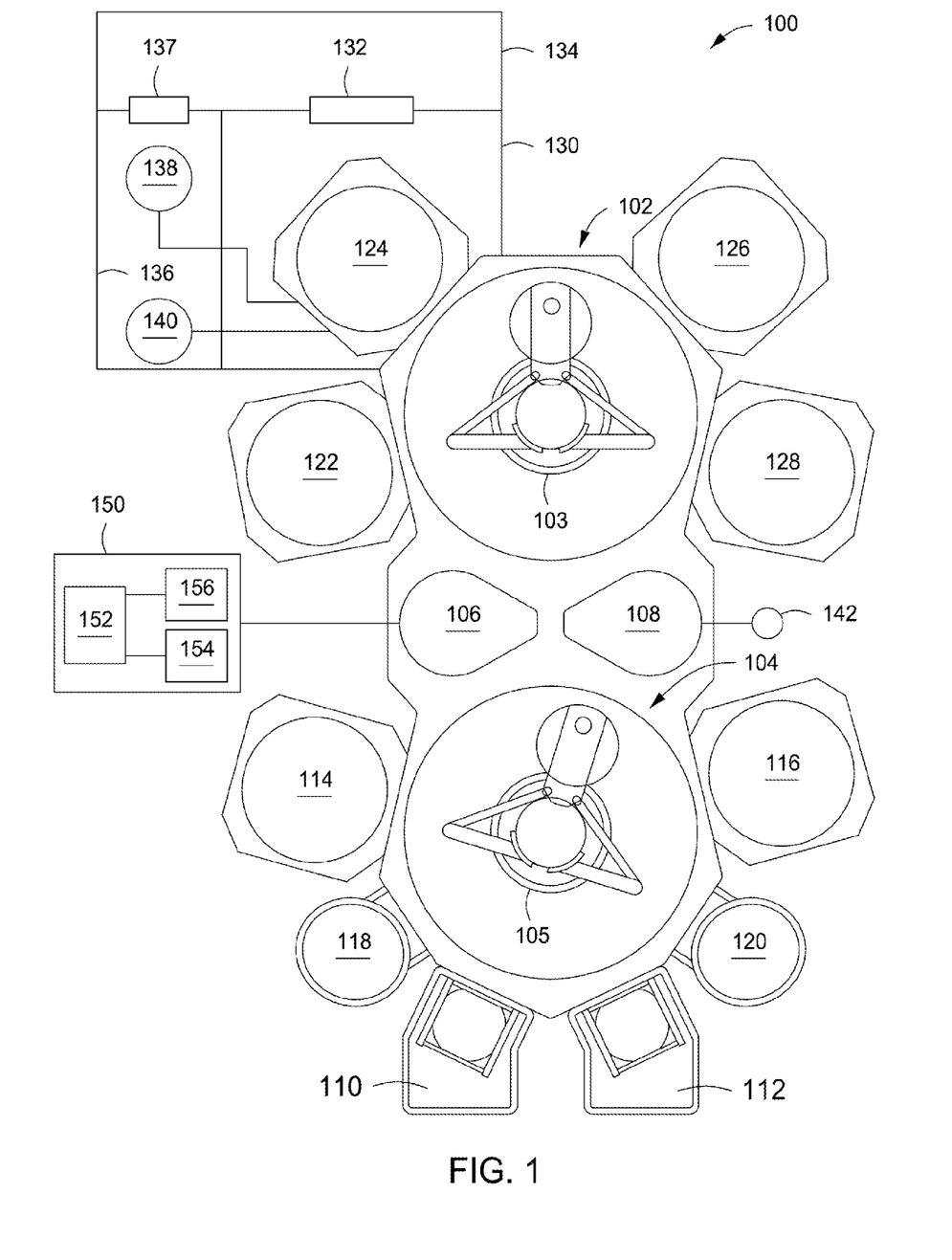
FIG. 1 depicts a schematic top view diagram of one example of a multi-chamber processing system which may be adapted to perform the processes disclosed herein.

FIG. 1 is a schematic top-view diagram of an exemplary multi-chamber processing system 100 in accordance with some embodiments of the present invention. Examples of suitable multi-chamber processing systems include the ENDURA®, CENTURA®, and PRODUCER® processing systems, commercially available from Applied Materials, Inc. Another similar multi-chamber processing system that may be adapted to benefit from the invention is disclosed in U.S. Pat. No. 5,186,718, entitled "Stage Vacuum Wafer Processing System and Method," issued on Feb. 16, 1993.

The system 100 generally includes a first transfer chamber 102 and a second transfer chamber 104. The first and second transfer chambers 102, 104 may be vacuum chambers and may be separated by one or more intermediate load lock chambers 106, 108 coupling the second transfer chamber 104 to the first transfer chamber 102. The first and second transfer chambers 102, 104 are capable of transferring substrates to and receiving substrates from one or more process chambers coupled to the first or second transfer chambers 102, 104. At least one of the process chambers (e.g., a first process chamber) may be configured to deposit one or more III-V materials, as discussed below and as depicted in FIGS. 2-5.

The system 100 may further include load lock chambers 110, 112 to transfer substrates into and out from the system 100. For example, the load lock chambers 110, 112 may be coupled to the second transfer chamber 104 as depicted in FIG. 1. The load lock chambers 110, 112 are vacuum chambers that can be selectively "pumped down" to a vacuum pressure at or near that in the transfer chamber, or brought to a pressure at or near the ambient room pressure to facilitate entry and egress of substrates into and out of to the system 100.

A plurality of process chambers may be coupled to the second transfer chamber 104. For example, as shown in FIG. 1, process chambers 114, 116, 118, and 120 are shown coupled to the second transfer chamber 104 (although greater or fewer process chambers may be provided). Each process chamber 114, 116, 118, and 120 may be configured to perform particular substrate processing operations such as, but not limited to, cyclical layer deposition including atomic layer deposition (ALD), chemical vapor deposition (CVD), physical vapor deposition (PVD), etch, pre-clean, de-gas, anneal, orientation, or other substrate processes.

For example, in some embodiments, the process chamber 114 (e.g., a second process chamber) may be configured to plasma clean the substrate. For example, the plasma cleaning may occur immediately after the substrate enters the system 100 via one of the load locks 110, 112, and/or between any one or more processes performed on the substrate in the system 100. An exemplary plasma cleaning chamber may be a SICONI™ chamber, available from Applied Materials, Inc. of Santa Clara, Calif.

In some embodiments, the process chamber 116 (e.g., a third process chamber) may be configured to deposit a high-k dielectric material. For example, such high-k dielectric materials may be deposited by any suitable process, such as atomic layer deposition (ALD), chemical vapor deposition (CVD), physical vapor deposition (PVD), or the like. Exemplary high-k dielectric materials that may be deposited may include one or more of hafnium oxide ($HfO_2$), alumina ($Al_2O_3$), lanthanum aluminate ($LaAlO_3$), or the like. For example, the high-k dielectric material may be used as a gate dielectric in a transistor device or the like.

The second transfer chamber 104 may include a second robot 105 to transfer substrates, for example substrate 225 discussed below, between the load lock chambers 110, 112, and one or more process chambers 114, 116, the one or more intermediate load lock chambers 106, 108, and other chambers 118, 120. Similarly, the first transfer chamber 102 may include a first robot 103 to transfer substrates (e.g., substrate 225) between process chambers coupled to the first transfer chamber 103 and the one or more intermediate load lock chambers 106, 108.

A plurality of process chambers may be coupled to the first transfer chamber 102. For example, as shown in FIG. 1, process chambers 122, 124, 126, and 128 are shown coupled to the first transfer chamber 102 (although greater or fewer process chambers may be provided). Similar to process chambers 114, 116, 118, and 120, the process chambers 122, 124, 126, and 128 can be configured to perform particular substrate processing operations, such as, but not limited to, cyclical layer deposition including atomic layer deposition (ALD), chemical vapor deposition (CVD), physical vapor deposition (PVD), etch, pre-clean, de-gas, anneal, orientation, or the like.

For example, in some embodiments, the process chamber 124 may be configured to deposit one or more III-V materials (e.g., the first process chamber referred to above). Embodiments of the first process chamber are discussed below with respect to FIGS. 2-5. The process chamber 124 (e.g., the first process chamber) may include a first enclosure 130 surrounding the process chamber 124 and ventilating to an exhaust system of the facility (not shown). The first enclosure 130 may include an access port 132 for user access to the process chamber 124 while the process chamber 124 is idle or the like. The process chamber 124 may include a second enclosure 134 disposed adjacent to the first enclosure 130. For example, the first enclosure 130 may be selectively opened to the second enclosure 134 via the access port 132 between the first and second enclosures 130, 134. The second enclosure 134 may allow a user, service personnel or the like to perform service on the process chamber 124 without impairing the operation of the other chambers of the system 100.

The process chamber 124 may include a chemical delivery system 136, such as a gas cabinet or the like disposed adjacent to the process chamber, for example, such as in the first enclosure 130 or adjacent to the first enclosure 130. A detailed description of an exemplary chemical delivery system 136 is disclosed in U.S. patent application Ser. No. 61/478,755, filed on Apr. 25, 2011, by David K. Carlson, et. al, and entitled "CHEMICAL DELIVERY SYSTEM". In some embodiments, the chemical delivery system 136 may include a first gas source 138 coupled to an injector 214 of the process chamber 124 (discussed below with respect to FIGS. 2-4) to provide a first process gas comprising a Group III element; and a second gas source 140 coupled to the injector 214 to provide a second process gas comprising a Group V element. Similar to the process chamber 124, the chemical delivery system 136 may be accessed from the second enclosure 134, for example through a second access port 137 as shown, or alternatively through the access port 132 if no second access port 137 is present.

For example, in some embodiments, a process chamber, such as either process chamber 126 or 128, (e.g., a fourth process chamber) may be configured to anneal the substrate. For example, the fourth process chamber may be configured to anneal the substrate prior to and/or after processing in another of chamber of the system 100. For example, the fourth process chamber may be a rapid thermal process (RTP) chamber or the like, capable of heating the substrate, for example, to temperatures ranging from about 200 to about 800 degrees Celsius.

In some embodiments, the process chamber 126 (e.g., a fifth process chamber) may be configured to deposit one or more III-V materials. The fifth process chamber may be substantially equivalent to the embodiments of the first process chamber discussed above and below with respect to FIGS. 2-6. Further, the process chamber 126 may include a first enclosure, second enclosure, chemical delivery system and the like as discussed above when configured to deposit III-V materials. In some embodiments, the first process chamber (e.g., process chamber 124) may be configured to deposit n-type III-V materials and the second process chamber (e.g., process chamber 126) may be configured to deposit p-type III-V materials.

The one or more intermediate load lock chambers 106, 108 may be used to maintain ultrahigh vacuum conditions while allowing substrates to be transferred within the system 100. The one or more intermediate load lock chambers 106, 108 may allow for independent and/or isolated ambient control between the first and second transfer chambers 102, 104. For example, the one or more intermediate load locks 106, 108 may allow for the first and second transfer chambers 102, 104 may have one or more independently controlled chamber parameters. For example, the one or more independently controlled chamber parameters may include one or more of transfer chamber pressure, purge gas flow through the transfer chamber, transfer chamber moisture level, or residual gas level within the respective transfer chamber.

In some embodiments, the one or more intermediate load lock chambers 106, 108 may include a gas source 142 coupled to the one or more intermediate load lock chambers 106, 108 to expose the substrate to a gas when the substrate is placed within the one or more intermediate load lock chambers 106, 108. For example, gas source may provide a passivation gas or the like as the substrate passes through the one or more intermediate load lock chambers 106, 108 between processes. Examples of suitable gases include hydrogen sulfide ($H_2S$), ammonium sulfide ($NH_4S$), hydrogen ($H_2$), or the like. Further, the one or more intermediate load lock chambers 106, 108 may be used as cooling or heating chambers or the like. Alternatively, any of the process chambers couple to the first or second transfer chambers 102, 104 may be utilized as a cooling chamber.

A controller 150 may be coupled to the process system 100 to control the operation of the process system 100 and/or the individual components of the system 100. The controller 150 may be one of any form of general-purpose computer processor that can be used in an industrial setting for controlling various chambers and sub-processors. The memory, or computer-readable medium, 154 of the CPU 152 may be one or more of readily available memory such as random access memory (RAM), read only memory (ROM), floppy disk, hard disk, or any other form of digital storage, local or remote. The support circuits 156 are coupled to the CPU 152 for supporting the processor in a conventional manner. These circuits include cache, power supplies, clock circuits, input/output circuitry and subsystems, and the like.

Figure 2:
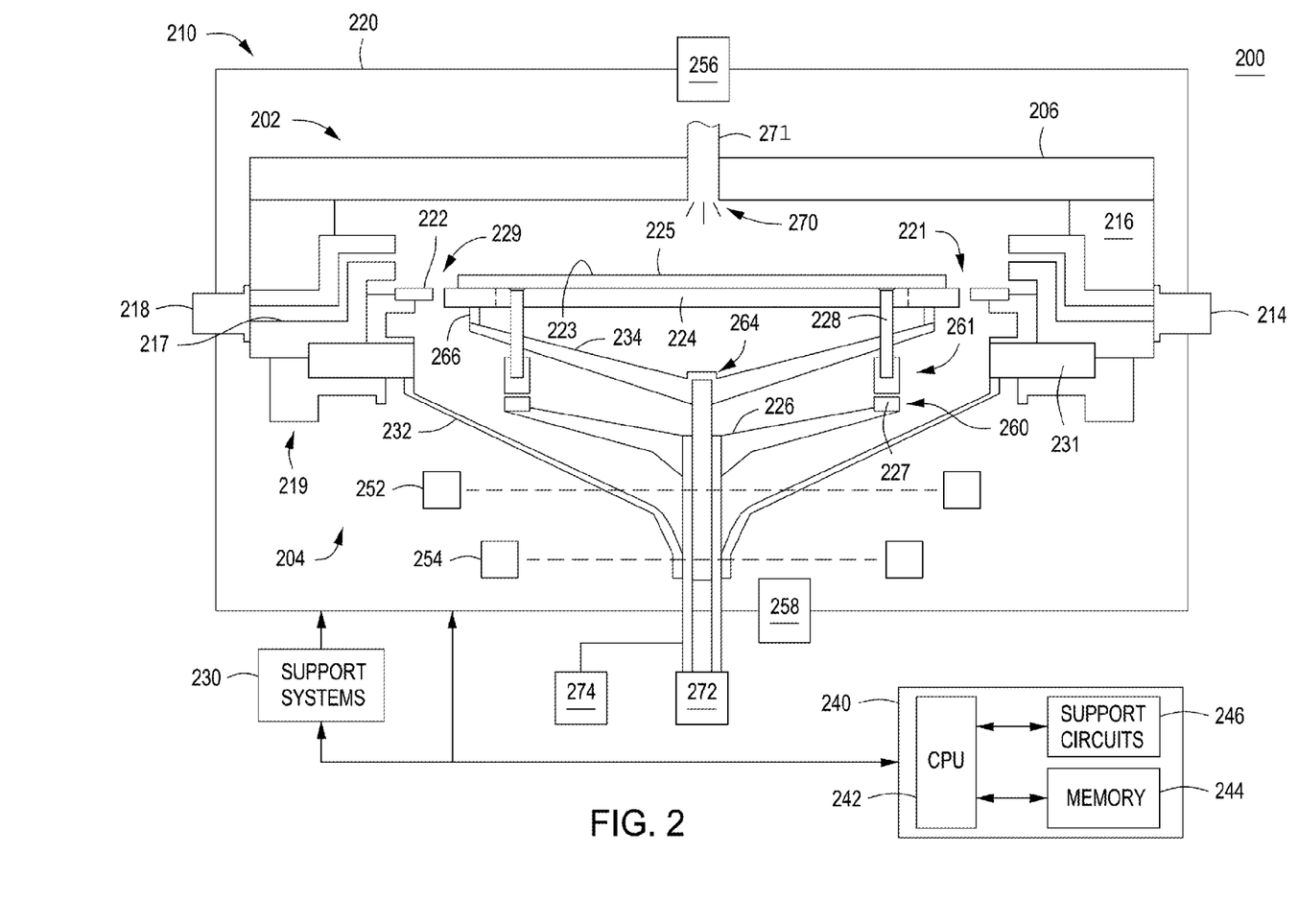
FIG. 2 depicts a schematic side view of a process chamber in accordance with some embodiments of the present invention.

FIG. 2 depicts a schematic side view of a process chamber 200 in accordance with some embodiments of the present invention. In some embodiments, the process chamber 200 may be modified from a commercially available process chamber, such as the RP EPI®, reactor, available from Applied Materials, Inc. of Santa Clara, Calif., or any suitable semiconductor process chamber adapted for performing epitaxial silicon deposition processes. The process chamber 200 may be adapted for performing epitaxial deposition processes and illustratively comprises a chamber body 210, a temperature-controlled reaction volume 201, an injector 214, an optional showerhead 270, and a heated exhaust manifold 218. The process chamber 200 may further include support systems 230, and a controller 240, as discussed in more detail below.

The injector 214 may be disposed on a first side 221 of a substrate support 224 disposed inside the chamber body 210 to provide a plurality of process gases, such as a first process gas and a second process gas across a processing surface 223 of a substrate 225 when the substrate is disposed on the substrate support 224. The plurality of process gases may be provided, for example, from a gas panel 208. The injector 214 may have a first flow path to provide the first process gas and a second flow path to provide the second process gas independent of the first process gas. Embodiments of the first and second flow paths are discussed below with respect to FIGS. 4A-C.

The heated exhaust manifold 218 may be disposed to a second side 229 of the substrate support 224, opposite the injector 214, to exhaust the first and second process gases from the process chamber 200. The heated exhaust manifold 218 may include an opening that is about the same width as the diameter of the substrate 225 or larger. The heated exhaust manifold may include an adhesion reducing liner 217. For example, the adhesion reducing liner 217 may comprise one or more of quartz, nickel impregnated fluoropolymer, nickel dioxide, or the like.

The chamber body 210 generally includes an upper portion 202, a lower portion 204, and an enclosure 220. The upper portion 202 is disposed on the lower portion 204 and includes a chamber lid 206 and an upper chamber liner 216. In some embodiments, an upper pyrometer 256 may be provided to provide data regarding the temperature of the processing surface of the substrate during processing. Additional elements, such as a clamp ring disposed atop the chamber lid 206 and/or a baseplate on which the upper chamber liner may rest, have been omitted from FIG. 2, but may optionally be included in the process chamber 200. The chamber lid 206 may have any suitable geometry, such as flat (as illustrated) or having a dome-like shape (not shown), or other shapes, such as reverse curve lids are also contemplated. In some embodiments, the chamber lid 206 may comprise a material, such as quartz or the like. Accordingly, the chamber lid 206 may at least partially reflect energy radiated from the substrate 225 and/or from lamps disposed below the substrate support 224. In embodiments where the showerhead 270 is provided and is a separate component disposed below the lid (not shown), the showerhead 270 may comprise a material such as quartz or the like, for example, to at least partially reflect energy as discussed above. The upper chamber liner 216 may be disposed above the injector 214 and heated exhaust manifold 218 and below the chamber lid 206, as depicted. In some embodiments the upper chamber liner 216 may comprises a material, such as quartz or the like, for example, to at least partially reflect energy as discussed above. In some embodiments, the upper chamber liner 216, the chamber lid 206, and a lower chamber liner 231 (discussed below) may be quartz, thereby advantageously providing a quartz envelope surrounding the substrate 225.

The lower portion 204 generally comprises a baseplate assembly 219, a lower chamber liner 231, a lower dome 232, the substrate support 224, a pre-heat ring 222, a substrate lift assembly 260, a substrate support assembly 264, a heating system 251, and a lower pyrometer 258. The heating system 251 may be disposed below the substrate support 224 to provide heat energy to the substrate support 224. The heating system 251 may comprise one or more outer lamps 252 and one or more inner lamps 254. Although the term "ring" is used to describe certain components of the process chamber, such as the pre-heat ring 222, it is contemplated that the shape of these components need not be circular and may include any shape, including but not limited to, rectangles, polygons, ovals, and the like. The lower chamber liner 231 may be disposed below the injector 214 and the heated exhaust manifold 218, for example, and above the baseplate assembly 219. The injector 214 and the heated exhaust manifold 218 are generally disposed between the upper portion 202 and the lower portion 204 and may be coupled to either or both of the upper portion 202 and the lower portion 204.

Figure 3:
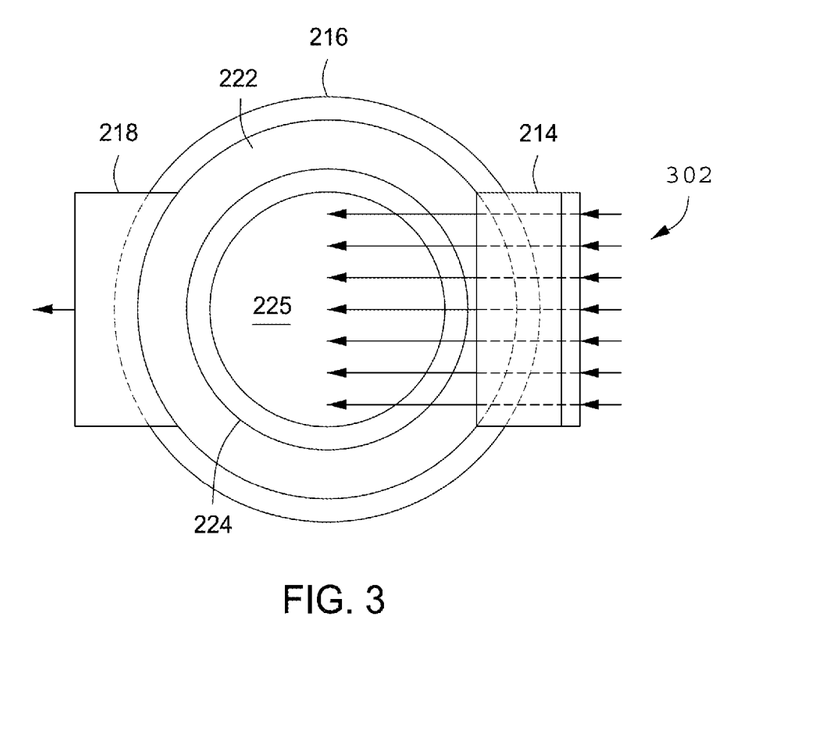
FIG. 3 depicts a partial schematic top view of an injector and an exhaust port of the process chamber of FIG. 2 in accordance with some embodiments of the present invention.

FIG. 3 depicts a partial schematic top view of the process chamber 200 showing the configuration of the injector 214 and the heated exhaust manifold 218. As illustrated, the injector 214 and the heated exhaust manifold 218 are disposed on opposing sides of the substrate support 224. The injector 214 may include a plurality of injector ports 302 to provide the process gases to the inner volume of process chamber 200. The plurality of injector ports 302 may be disposed periodically along a substrate facing edge of the injector 214 in a pattern suitable to provide a flow of the first and second process gases substantially across the processing surface 223 of the substrate 225. For example, the plurality of injector ports 302 may be disposed periodically along the substrate facing edge of the injector 214 from a first side of the injector 214 proximate a first side of the substrate 225 to an opposing second side of the injector 214 proximate a second side of the substrate 225.

In some embodiments, the plurality of injector ports 302 may be configured to provide the first and second process gases independently of each other. For example, the first process gas may be provided by a plurality of first injector ports and the second process gas may be provided by a plurality of second injector ports. The size, number, and configuration of the plurality of first injector ports may be controlled to provide a desired flow of the first process gas across the processing surface of the substrate. The size, number, and configuration of the plurality of second injector ports may be independently controlled to provide a desired flow of the second process gas across the processing surface of the substrate. In addition, the relative size, number, and configuration of the plurality of first injector ports as compared to the plurality of second injector ports may be controlled to provide a desired concentration or flow pattern of the first process gas relative to the second process gas across the processing surface of the substrate.

Figure 4A:
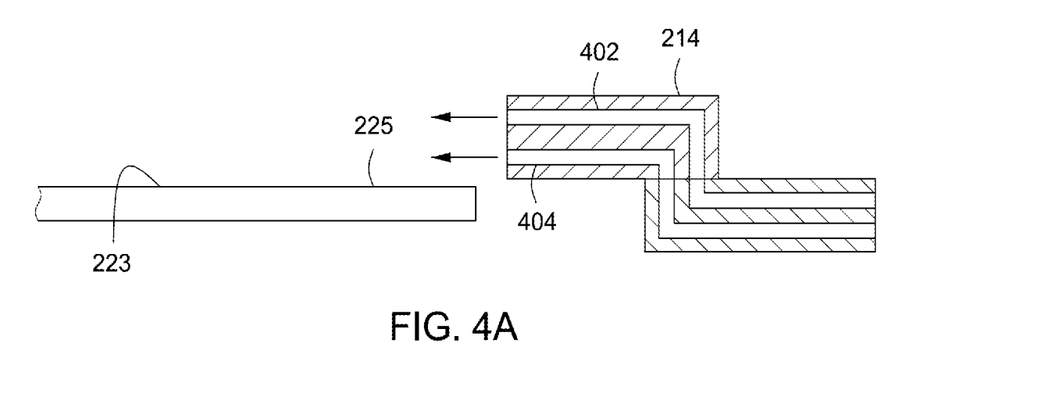
FIGS. 4A-C respectively depict schematic front and side views of injectors in accordance with some embodiments of the present invention.
Figure 4B:
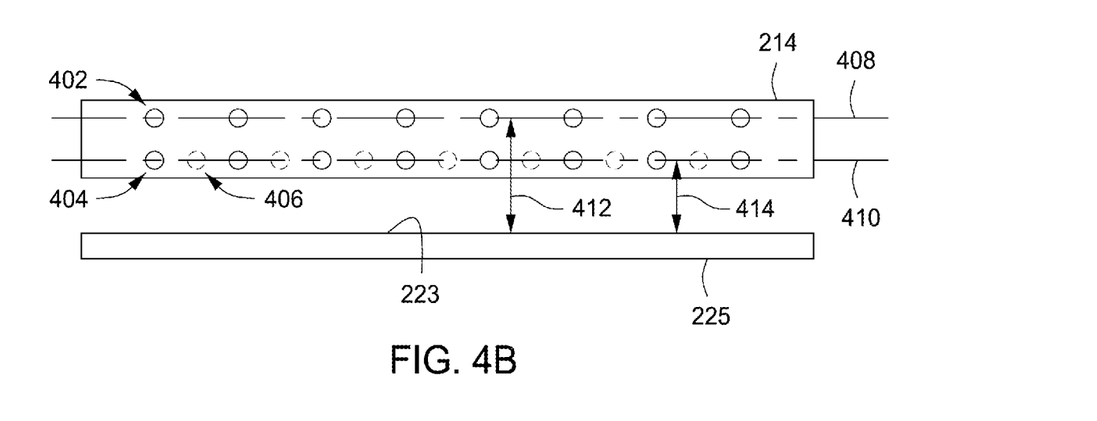

In some embodiments, as illustrated in a schematic side view in FIG. 4A, the injector 214 may include a plurality of first injector ports 402 (e.g., a first flow path) to inject the first process gas and a plurality of second injector ports 404 (e.g., a second flow path) to inject the second process gas. As illustrated in FIG. 4A, the pluralities first and second injector ports 402, 404 may be in a non-planar arrangement with respect to each other. In some embodiments, each of the plurality of first injector ports 402 may be disposed above each of the plurality of second injector ports 404 (or vice-versa). Each of the plurality of first injector ports 402 may be disposed above each of the plurality of second injector ports 404 in any desired arrangement, such as in a parallel planar arrangement, as illustrated in FIG. 4B. For example, a parallel planar arrangement may be where the pluralities of first and second injector ports 402, 404 are disposed in separate planes, wherein each plane is parallel to the processing surface 223 of the substrate 225. For example, as illustrated in FIG. 4B, each of the plurality of first injector ports 402 is disposed along a first plane 408 at a first height 412 above the substrate 225 and each of the plurality of second injector ports 404 is disposed along a second plane 410 at a second height 414 above the substrate 225 that differs from the first height 412. In some embodiments, respective ones of the plurality of first injector ports 402 may be disposed directly above (e.g., in vertical alignment with) corresponding ones of the plurality of second injector ports 404. In some embodiments, one or more individual ports of the first and second injector ports 402, 404 may be in non-vertical alignment, such as illustrated by dashed injector ports 406 (which may be provided in addition to or alternatively to second injector ports 404, as illustrated, and/or in addition to or alternatively to first injector ports 402).

Figure 4C:
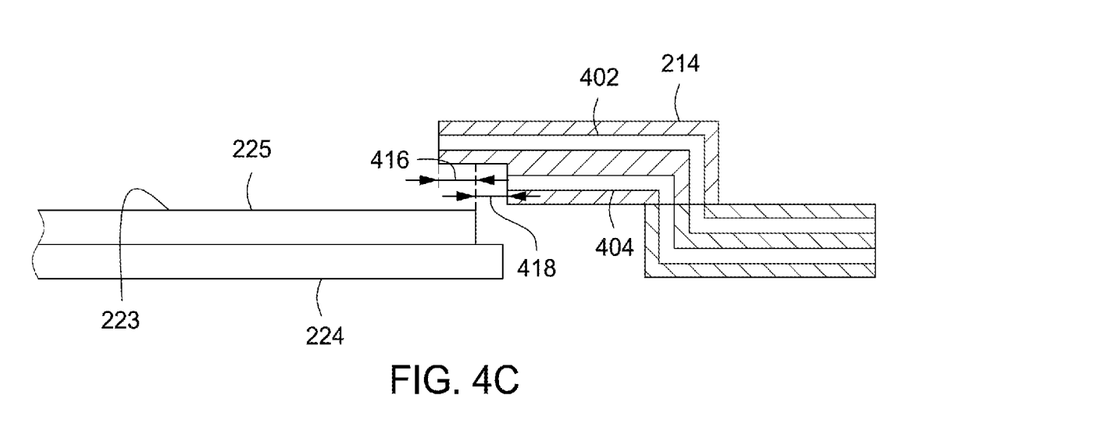

In some embodiments, for example as illustrated in FIG. 4C, the plurality of first injector ports 402 may be disposed at a first distance 416 from an edge of the substrate 225 when positioned on the substrate support 224 and the plurality of second injector ports 404 may be disposed at a second distance 418 from an edge of the substrate 225 when positioned on the substrate support 224. For example, the phrase "when positioned on the substrate support 224" is meant to be understood as the desired position that the substrate 225 is expected to assume for processing in the process chamber 200. For example, the substrate support 224 may include a lip (not shown) or other suitable positioning mechanisms for aligning and/or maintaining the substrate 225 in the desired processing position. Accordingly, the first and second distances 416, 418 may be measured from the edge of the substrate 225 when the substrate 225 is in the desired processing position. For example, as illustrated in FIG. 4B, the first and second distances 416, 418 may be different. In some embodiments, the plurality of first injector ports 402 may extend beyond (or further beyond) the edge of the substrate 225 than the plurality of second injector ports 404. For example, the plurality of first injector ports 402 may extend further than the plurality of second injector ports 404 to inject the first process gas further into the temperature-controlled reaction volume 201 than the plurality of second injector ports 404 inject the second process gas because the first process gas may more susceptible to decomposition under temperature conditions than the second process gas. For example, to maximize reaction of the first process gas prior to decomposition, the plurality of first injectors may be positioned to inject the first process gas as far into the temperature-controlled reaction volume 201 prior to exposure of the first process gas to the temperature-controlled reaction volume 201.

Figure 5A:
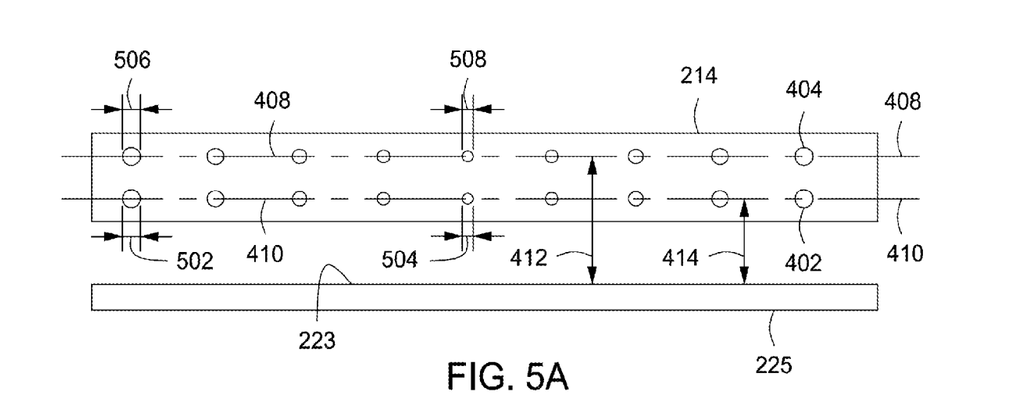
FIGS. 5A-B respectively depict schematic front views of injectors in accordance with some embodiments of the present invention.
Figure 5B:
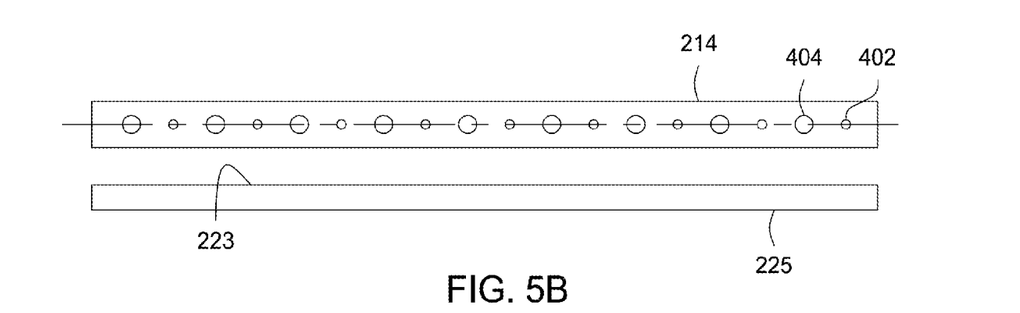

The number, size, and configuration of the first injector ports 402 and the second injector ports 404 may be controlled in numerous combinations to provide various benefits. For example, in some embodiments, some or all of the plurality of first injector ports 402 may have a different diameter than some or all of the plurality of second injector ports 404. Controlling the diameter of the injector ports facilitates control of the velocity of the process gas entering the process chamber via that injection port. A smaller diameter port will provide a process gas at a higher velocity than a larger diameter port at a given upstream pressure. For example, in some embodiments, each of the plurality of second injector ports 404 may have a larger diameter than each of the plurality of first injector ports 402, as shown in FIGS. 5A-5B. For example, each second injector port 402 may have a larger diameter to inject the second process gas at a lower velocity than the first process gas.

Alternatively or in combination, in some embodiments, a first diameter 504 of one of the plurality of first injector ports 402 disposed nearer to a center of the injector may be different than a second diameter 502 of another of the plurality of first injector ports disposed nearer to a edge of the injector 214, as shown in FIG. 5A. Similarly, in some embodiments, a first diameter 508 of one of the plurality of second injector ports 404 disposed nearer to a center of the injector 214 may be different than a second diameter 506 of another of the plurality of second injector ports 404 disposed nearer to a edge of the injector 214. For example, as illustrated in FIG. 5A, the diameters of the first or second injector ports 402, 404 may be gradually reduced from the edge to center of the injector 214, for example, in linearly decreasing reduction scheme or any suitable reduction scheme, non-linear or the like. Alternatively, the diameters of the first or second injector ports 402, 404 may be more coarsely reduced from the edge to the center of the injector 214, for example, such as a stepwise reduction scheme or the like.

Alternatively or in combination, in some embodiments, each of the pluralities of first and second injector ports 402, 404 may be disposed in a co-planar arrangement, as illustrated in FIG. 5B. For example, each of the pluralities of first and second injector ports 402, 404 may be disposed at about the same height above the substrate 225, or in a plane parallel to the processing surface 223 of the substrate 225. In some embodiments, when disposed in a co-planar arrangement, individual ones of the pluralities of first and second injector ports 402, 404 may be alternately disposed, as shown in FIG. 5B. Alternatively, two or more of the first and/or the second injector ports 402, 404 may be grouped together into a subset of first injector ports 402 and/or second injector ports 404 with the subset interposed between adjacent injector ports of the other plurality.

Returning to FIG. 2, in some embodiments, a showerhead 270 may be disposed above the substrate support 224 (e.g., opposing the substrate support 224) to provide a third process gas to the processing surface 223 of the substrate 225. The third process gas may be the same as the first process gas, the same as the second process gas, or different than the first and second process gases provided by the injector 214. In some embodiments, the third process gas is the same as the first process gas. The third process gas may also be provided, for example, from the gas panel 208.

In some embodiments, for example as illustrated in FIG. 2, the showerhead 270 may include a single outlet 271 for providing the third process gas to the processing surface 223 of the substrate 225. In some embodiments, as illustrated in FIG. 2, the single outlet 271 may be disposed in a position that is substantially aligned with a center of the processing surface 223, or with a center of the substrate support 224.

Figure 6:
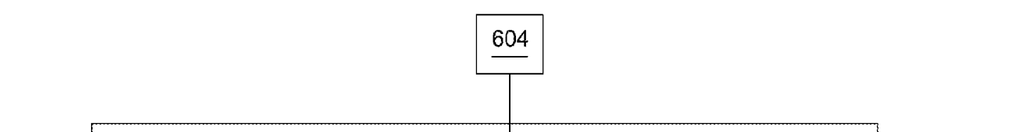
FIG. 6 depicts a schematic side view of a showerhead in accordance with some embodiments of the present invention.

In some embodiments, the showerhead 270 may include a plurality of outlets 602, as illustrated in FIG. 6. In some embodiments, the plurality of outlets 602 may be grouped together (e.g., disposed within a circle having a diameter of no greater than about 4 inches). The plurality of outlets may be disposed in a position that is substantially aligned with a desired area of the processing surface, for example, the center of the processing surface to deliver the first process gas (for example from a gas source 604) to the processing surface 223 of the substrate 225. Although illustrated as having three outlets 602, the showerhead 270 can have any desirable number of outlets suitable for providing the third process gas. In addition, although shown as aligned with the center of the processing surface, the single outlet or the plurality of outlets may be aligned with any desired area of the processing surface to provide the process gases to the desired area of the substrate during processing.

The showerhead 270 may be integral with the chamber lid 206 (as shown in FIG. 2), or may be a separate component (as shown in FIG. 6). For example, the outlet 271 may be a hole bored into the chamber lid 206 and may optionally include inserts disposed through the hole bored into the chamber lid 206. Alternatively, the showerhead 270 may be a separate component disposed beneath the chamber lid 206. In some embodiments, the showerhead 270 and the chamber lid 206 may both comprise quartz, for example, to limit energy absorption from the lamps 252, 254 or from the substrate 225 by the showerhead 270 or the chamber lid 206.

Embodiments of the injector 214 and, optionally, the showerhead 270 as described above may be utilized to facilitate optimal deposition uniformity and composition control with minimal residue formation. For example, as discussed above, specific reactants, such as the first and second gases, may be directed through independently controllable injector ports of the injector 214 and/or outlets of the showerhead 270. The injection scheme facilitated by the embodiments of the injector 214 and, optionally, the showerhead 270 may allow for matching the flow velocity and/or flow profile of each reactant with its reactivity relative to the other reactants flowing in the process chamber 200. For example, as discussed below the first process gas may be flowed at a higher flow velocity than the second process gas because the first process gas can be more reactive and may dissociate faster than the second process gas. Accordingly, to match the reactivity of the first and second process gases to limit residue formation, optimize uniformity and/or composition, the first process gas may be flowed at a higher velocity than the second process gas. The aforementioned injection scheme is merely exemplary, and other injection schemes are possible.

Returning to FIG. 2, the substrate support 224 may be any suitable substrate support, such as a plate (illustrated in FIG. 2) or ring (illustrated by dotted lines in FIG. 2) to support the substrate 225 thereon. The substrate support assembly 264 generally includes a support bracket 234 having a plurality of support pins 266 coupled to the substrate support 224. The substrate lift assembly 260 comprises a substrate lift shaft 226 and a plurality of lift pin modules 261 selectively resting on respective pads 227 of the substrate lift shaft 226. In one embodiment, a lift pin module 261 comprises an optional upper portion of the lift pin 228 that is movably disposed through a first opening 262 in the substrate support 224. In operation, the substrate lift shaft 226 is moved to engage the lift pins 228. When engaged, the lift pins 228 may raise the substrate 225 above the substrate support 224 or lower the substrate 225 onto the substrate support 224.

The substrate support 224 may further include a lift mechanism 272 and a rotation mechanism 274 coupled to the substrate support assembly 264. The lift mechanism 272 can be utilized to move the substrate support 224 in a direction perpendicular to the processing surface 223 of the substrate 225. For example, the lift mechanism 272 may be used to position the substrate support 224 relative to the showerhead 270 and the injector 214. The rotation mechanism 274 can be utilized for rotating the substrate support 224 about a central axis. In operation, the lift mechanism may facilitate dynamic control of the position of the substrate 225 with respect to the flow field created by the injector 214 and/or the showerhead 270. Dynamic control of the substrate 225 position in combination with continuous rotation of the substrate 225 by the rotation mechanism 274 may be used to optimize exposure of the processing surface 223 of the substrate 225 to the flow field to optimize deposition uniformity and/or composition and minimize residue formation on the processing surface 223.

During processing, the substrate 225 is disposed on the substrate support 224. The lamps 252, and 254 are sources of infrared (IR) radiation (i.e., heat) and, in operation, generate a pre-determined temperature distribution across the substrate 225. The chamber lid 206, the upper chamber liner 216, and the lower dome 232 may be formed from quartz as discussed above; however, other IR-transparent and process compatible materials may also be used to form these components. The lamps 252, 254 may be part of a multi-zone lamp heating apparatus to provide thermal uniformity to the backside of the substrate support 224. For example, the heating system 251 may include a plurality of heating zones, where each heating zone includes a plurality of lamps. For example, the one or more lamps 252 may be a first heating zone and the one or more lamps 254 may be a second heating zone. The lamps 252, 254 may provide a wide thermal range of about 200 to about 900 degrees Celsius. The lamps 252, 254 may provide a fast response control of about 5 to about 20 degrees Celsius per second. For example, the thermal range and fast response control of the lamps 252, 254 may provide deposition uniformity on the substrate 225. Further, the lower dome 132 may be temperature controlled, for example, by active cooling, window design or the like, to further aid control of thermal uniformity on the backside of the substrate support 224, and/or on the processing surface 223 of the substrate 225.

The temperature-controlled reaction volume 201 may be formed by the chamber lid 206 by a plurality of chamber components. For example, such chamber components may include one or more of the chamber lid 206, the upper chamber liner 216, the lower chamber liner 231 and the substrate support 224. The temperature controlled-processing volume 201 may include interior surfaces comprising quartz, such as the surfaces of any one or more of the chamber components that form the temperature-controlled reaction volume 201. The temperature-controlled reaction volume 201 may be about 20 to about 40 liters. The volume 201 may accommodate any suitably sized substrate, for example, such as 200 mm, 300 mm or the like. For example, in some embodiments, if the substrate 225 is about 300 mm, then the interior surfaces, for example of the upper and lower chamber liners 216, 231 may be up to about 50 mm away from the edge of the substrate 225. For example, in some embodiments, the interior surfaces, such as the upper and lower chamber liners 216, 231 may be at a distance of up to about 18% of the diameter of the substrate 225 away from the edge of the substrate 225. For example, in some embodiments, the processing surface 223 of the substrate 225 may be up to about 100 millimeters, or ranging from about 0.8 to about 1 inch from chamber lid 206

The temperature-controlled reaction volume 201 may have a varying volume, for example, the size of the volume 201 may shrink when the lift mechanism 272 raises the substrate support 224 closer to the chamber lid 206 and expand when the lift mechanism 272 lowers the substrate support 224 away from the chamber lid 206. The temperature-controlled reaction volume 201 may be cooled by one or more active or passive cooling components. For example, the volume 201 may be passively cooled by the walls of the process chamber 200, which for example, may be stainless steel or the like. For example, either separately or in combination with passive cooling, the volume 201 may be actively cooled, for example, by flowing a coolant about the chamber 200. For example, the coolant may be a gas.

The support systems 230 include components used to execute and monitor pre-determined processes (e.g., growing epitaxial silicon films) in the process chamber 200. Such components generally include various sub-systems. (e.g., gas panel(s), gas distribution conduits, vacuum and exhaust sub-systems, and the like) and devices (e.g., power supplies, process control instruments, and the like) of the process chamber 200. Exemplary support systems 230 may include the chemical delivery system 186 which is discussed above and illustrated in FIG. 1.

The controller 240 may be coupled to the process chamber 200 and support systems 230, directly (as shown in FIG. 2) or, alternatively, via computers (or controllers) associated with the process chamber and/or the support systems. The controller 240 may be one of any form of general-purpose computer processor that can be used in an industrial setting for controlling various chambers and sub-processors. The memory, or computer-readable medium, 244 of the CPU 242 may be one or more of readily available memory such as random access memory (RAM), read only memory (ROM), floppy disk, hard disk, or any other form of digital storage, local or remote. The support circuits 246 are coupled to the CPU 242 for supporting the processor in a conventional manner. These circuits include cache, power supplies, clock circuits, input/output circuitry and subsystems, and the like.

Thus, apparatus and methods for deposition of III-V materials have been provided herein. Embodiments of the inventive methods and apparatus may advantageously provide for the deposition of III-V films suitable for CMOS applications, amongst other applications.

While the foregoing is directed to embodiments of the present invention, other and further embodiments of the invention may be devised without departing from the basic scope thereof.

The invention claimed is:

1. A processing system, comprising:
a first transfer chamber capable of transferring a substrate to or receiving a substrate from one or more process chambers coupled to the first transfer chamber; and
a first process chamber to deposit one or more III-V materials coupled to the first transfer chamber, the process chamber further comprising:
a substrate support disposed therein to support a processing surface of a substrate at a desired position within the process chamber;
an injector disposed to a first side of the substrate support and having a first flow path to provide a first process gas and a second flow path to provide a second process gas independent of the first process gas, wherein the injector is positioned to provide the first and second process gases across the processing surface of the substrate;
a Group III element gas source coupled to the injector to provide the first process gas;
a Group V element gas source coupled to the injector to provide the second process gas;
a showerhead disposed above the substrate support to provide the first process gas to the processing surface of the substrate; and
a heated exhaust manifold disposed to a second side of the substrate support, coplanar with and opposite the injector, to exhaust the first and second process gases from the process chamber.

2. The processing system of claim 1, further comprising:
a second transfer chamber; and
one or more intermediate load lock chambers coupling the second transfer chamber to the first transfer chamber.

3. The processing system of claim 2, further comprising:
a gas source coupled to the one or more intermediate load lock chambers to expose a substrate to a gas when the substrate is placed within the one or more intermediate load lock chambers.

4. The processing system of claim 2, wherein the first and second transfer chambers have one or more independently controlled chamber parameters.

5. The processing system of claim 4, wherein the one or more independently controlled chamber parameters include one or more of pressure, purge gas flow, moisture level, or residual gas level.

6. The processing system of claim 2, further comprising:
a second process chamber to plasma clean a substrate; and
a third process chamber to deposit a high-k dielectric material, wherein the second and third process chambers are coupled to the second transfer chamber.

7. The processing system of claim 6, further comprising:
a fourth process chamber to anneal a substrate, wherein the fourth process chamber is coupled to the first transfer chamber.

8. The processing system of claim 7, further comprising:
a fifth process chamber to deposit one or more III-V materials coupled to the first transfer chamber.

9. The processing system of claim 8, wherein the first process chamber deposits n-type III-V materials and the fifth process chamber deposits p-type III-V materials.

10. The processing system of claim 1, wherein the first process chamber further comprises:
a first enclosure surrounding the first process chamber and ventilating to a house exhaust system; and
a second enclosure disposed adjacent to the first enclosure, wherein the first enclosure is selectively opened to the second enclosure via an access port between the first and second enclosure.

11. A processing system, comprising:
a first transfer chamber capable of transferring a substrate to or receiving a substrate from one or more process chambers coupled to the first transfer chamber; and
a first process chamber to deposit one or more III-V materials coupled to the first transfer chamber, the process chamber further comprising:
a substrate support disposed therein to support a processing surface of a substrate at a desired position within the process chamber;
an injector disposed to a first side of the substrate support and having a first flow path to provide a first process gas and a second flow path to provide a second process gas independent of the first process gas, wherein the injector is positioned to provide the first and second process gases across the processing surface of the substrate;
a first gas source coupled to the injector to provide the first process gas, wherein the first process gas comprises a Group III element;
a second gas source coupled to the injector to provide the second process gas, wherein the second process gas comprises a Group V element;
a showerhead disposed above the substrate support to provide the first process gas to the processing surface of the substrate; and
a heated exhaust manifold disposed to a second side of the substrate support, coplanar with and opposite the injector, to exhaust the first and second process gases from the process chamber.

12. The processing system of claim 11, further comprising:
a second transfer chamber; and
one or more intermediate load lock chambers coupling the second transfer chamber to the first transfer chamber.

13. The processing system of claim 12, further comprising:
a second process chamber to plasma clean a substrate; and
a third process chamber to deposit a high-k dielectric material, wherein the second and third process chambers are coupled to the second transfer chamber.

14. The processing system of claim 13, further comprising:
a fourth process chamber to anneal a substrate, wherein the fourth process chamber is coupled to the first transfer chamber.

15. The processing system of claim 14, wherein the first and second transfer chambers have one or more independently controlled chamber parameters including one or more of pressure, purge gas flow, moisture level, or residual gas level.

16. The processing system of claim 1, wherein the second flow path is different than the first flow path.

17. The processing system of claim 11, wherein the second flow path is different than the first flow path.

* * * * *